United States Patent
Talwar et al.

(10) Patent No.: US 6,274,488 B1
(45) Date of Patent: Aug. 14, 2001

(54) METHOD OF FORMING A SILICIDE REGION IN A SI SUBSTRATE AND A DEVICE HAVING SAME

(75) Inventors: Somit Talwar, Palo Alto; Yun Wang, San Jose, both of CA (US)

(73) Assignee: Ultratech Stepper, Inc., San Jose, CA (US)

( * ) Notice: Subject to any disclaimer, the term of this patent is extended or adjusted under 35 U.S.C. 154(b) by 0 days.

(21) Appl. No.: 09/547,836

(22) Filed: Apr. 12, 2000

(51) Int. Cl.$^7$ .................................................. H01L 21/44
(52) U.S. Cl. ..................... 438/655; 438/533; 438/301; 438/592; 438/662; 438/657
(58) Field of Search ..................... 438/655, 533, 438/586, 592, 649, 651, 657, 662, 664, 682, 158, 301–302, 305–308

(56) References Cited

U.S. PATENT DOCUMENTS

| | | |
|---|---|---|
| 4,522,845 | 6/1985 | Powell et al. .................. 427/53.1 |
| 4,622,735 | 11/1986 | Shibata .................................. 29/571 |
| 4,683,645 | 8/1987 | Naguib et al. ....................... 437/41 |
| 4,830,971 | 5/1989 | Shibata .................................. 437/29 |
| 4,924,294 | 5/1990 | Tanielian ............................... 357/71 |
| 4,931,353 | 6/1990 | Tanielian ............................. 437/200 |
| 5,010,032 | 4/1991 | Tang et al. ............................ 437/57 |
| 5,122,479 | 6/1992 | Audet et al. ........................ 437/200 |
| 5,236,865 | 8/1993 | Sandhu et al. ...................... 437/174 |
| 5,302,538 * | 4/1994 | Ishikawa et al. ................... 438/585 |
| 5,405,806 | 4/1995 | Pfiester et al. ..................... 437/200 |
| 5,563,100 | 10/1996 | Matsubara ......................... 437/200 |
| 5,593,923 | 1/1997 | Horiuchi et al. .................. 437/200 |
| 5,888,888 | 3/1999 | Talwar et al. ...................... 438/533 |
| 6,060,392 * | 5/2000 | Essaian et al. ..................... 438/682 |
| 6,072,222 * | 6/2000 | Nistler ................................ 257/383 |
| 6,174,774 * | 1/2001 | Lee ..................................... 438/279 |

FOREIGN PATENT DOCUMENTS

| | | |
|---|---|---|
| 6112158 | 4/1994 | (JP) . |
| 409172179 * | 6/1997 | (JP) ............................ H01L/21/336 |

OTHER PUBLICATIONS

Somit Talwar, Gaurav Verma, Kurt Weiner, Carol Gelatos, Laser Thermal Processing for Shallow Junction and Silicide Formation, Proceedings of SPIE, Sep. 1998, pp. 74–81.

(List continued on next page.)

*Primary Examiner*—Charles Bowers
*Assistant Examiner*—Thanh Nguyen
(74) *Attorney, Agent, or Firm*—Allston L. Jones (57) ABSTRACT

A method of forming a silicide region (80) on a Si substrate (10) in the manufacturing of semiconductor integrated devices, a method of forming a semiconductor device (MISFET), and a device having suicide regions formed by the present method. The method of forming a silicide region involves forming a silicide region (80) in the (crystalline) Si substrate having an upper surface (12) and a lower surface (14). The method comprises the steps of first forming an amorphous doped region (40) in the Si substrate at or near the upper surface, to a predetermined depth (d). This results in the formation of an amorphous-crystalline interface (I) between the amorphous doped region and the crystalline Si substrate. The next step is forming a metal layer (60) atop the Si substrate upper surface, in contact with the amorphous doped region. The next step involves performing backside irradiation with a first radiation beam (66). This heats the interface sufficient to initiate explosive recrystallization (XRC) of amorphous doped region. This, in turn, provides heat to the metal layer sufficient to cause the diffusion of metal atoms from the metal layer into the amorphous doped region. In this manner, a silicide region of very high quality and low sheet resistance is formed in the Si substrate.

27 Claims, 4 Drawing Sheets

OTHER PUBLICATIONS

W. K. Chu, B. J. Masters, J. Riseman, Contact Formation by Laser Annealing of Implanted Silicon, IBM Technical Disclosure Bulletin, vol. 22, No. 12, May 1980, p 5355.

M. M. Moslehi, Single–Wafer Optical Processing of Semiconductors: Thin Insulator Growth for Integrated Electronic Device Applications, Applied Physics A, 46, 1988, pp 255–273.

Fred Roozeboom, N. Parekh, Rapid Thermal Processing systems: A Review with Emphasis on Temperature Control, J. Vac. Sci. Technol. B., vol 8, No. 6, pp 1249–1259, Dec. 1990.

* cited by examiner

METHOD OF FORMING A SILICIDE REGION IN A SI SUBSTRATE AND A DEVICE HAVING SAME

FIELD OF THE INVENTION

The present invention pertains to a method of forming a silicide region on a silicon substrate in the manufacturing of semiconductor integrated devices, and such devices having a suicide region formed by the method of the present invention.

BACKGROUND OF THE INVENTION

Improvements in semiconductor technology and semiconductor manufacturing are the main drivers to the reduction of cost and the increase in speed of computers. There have been many advances for increasing the speed of semiconductor devices, ranging from packaging of integrated circuits ("chips") to the wiring of the devices on the chip, to the devices themselves.

Improvements in chip manufacturing techniques include new processes (or improving an existing process) for making the chip. Such improvements may include new, faster and more efficient ways of creating the necessary device structures. For example, many techniques have been developed for forming silicide regions for integrated device contacts, particularly for metal-oxide-semiconductor (MOS) devices formed on silicon substrates. Most of these techniques involve the formation of a metal layer over a gate, drain or source region upon which the silicide is desired to be formed. These techniques then use a thermal treatment to react the metal with the silicon composing the gate, drain and/or source regions, to form the low-resistivity silicide regions. The substrate is further processed by removing the unreacted metal layer, then forming an electrically-insulating layer over the substrate, and finally forming conductive metal lines on the insulating layer. These metal lines can contact the silicide regions over the gate, source and drain regions to form the desired circuit connections for an integrated MOS device.

Techniques for forming suicides are subject to several stringent process constraints that must be met in order for such techniques to be effective. These constraints include: (1) the metal used to form the silicide must be carefully selected to be a species that diffuses into the silicon, to avoid the formation of leakage paths between the source, drain and gate of an integrated device; (2) for self-aligned silicidation techniques, the metal layer must not react with the insulative material composing the self-aligning side walls of the gate; (3) the dopants must not segregate into the silicide regions, which makes it difficult to achieve low contact resistance; (4) the technique should have a process window that allows the silicide region to be formed on both crystalline-silicon and poly-silicon; (5) the silicide formation should be insensitive to dopants present in the silicon; and (6) the metal atoms should not diffuse beyond the suicide regions, that is, into the silicon. If metal atoms diffuse into the silicon, junction leakage will likely increase. The simultaneous fulfillment of all of the above-stated criteria is at best difficult for most conventional silicidation techniques, especially those that use relatively extensive thermal treatments. Most often, a failure to perform the conventional technique within its relatively narrow process margins manifests itself as defects due to thermal drift of the metal atoms beyond desired boundaries during the relatively prolonged thermal treatment periods. If the silicide region extends beyond its design dimensions, it can result in-leakage paths between the gate and the source and drain. Therefore a great need exists for a technique that enhances silicidation process margins beyond those conventionally available.

U.S. Pat. No. 5,888,888 (the '888 patent) discloses a method of producing a silicide region on a Si substrate. The '888 patent is incorporated herein by reference. The method disclosed in the '888 patent is useful for a variety of purposes, including the reduction of the electrical contact resistance to the Si substrate or an integrated electronic device formed thereon. The method includes the step of irradiating a metal layer formed atop the source and drain regions with front side irradiation i.e., irradiating the metal layer from the front side of the silicon substrate to initiate diffusion of the metal into the silicon substrate. While this method is very useful, it would still be preferable to be able to heat the metal layer by other means that result in quicker silicidation.

SUMMARY OF THE INVENTION

The present invention pertains to a method of forming a silicide region on a silicon substrate in the manufacturing of semiconductor integrated devices, and such devices having a silicide region formed by the method of the present invention.

Accordingly, a first aspect of the invention is a method of forming a silicide region in a crystalline Si substrate having an upper surface and a lower surface. The method comprises the steps of first, forming an amorphous doped region in the Si substrate at or near the upper surface to a predetermined depth. This results in an interface being formed between the amorphous doped region and the crystalline Si substrate. This interface is referred to herein as the amorphous-crystalline interface. The next step is forming a metal layer on the upper surface of the Si substrate, in contact with the amorphous doped region. The next step is then performing backside irradiation with a first radiation beam to heat the interface to initiate explosive recrystallization (XRC) of the region. This provides heat to the metal layer sufficient to cause diffusion of metal from the metal layer into the amorphous doped region, as described in greater detail below. The diffusion of the metal, in turn, results in the silicide region being formed in the amorphous doped region at or near the upper surface of the Si substrate.

A second aspect of the invention is a method of forming a MISFET device in a Si substrate having upper and lower surfaces and silicide regions. The method comprises the steps of first, forming spaced apart shallow trench isolations in the Si substrate. The next step is forming, atop the upper surface of the Si substrate and between the shallow isolation trenches, a gate having sides. The next step is then performing a first amorphization and doping of first and second portions of the Si substrate adjacent the gate to form extension regions having a first predetermined depth from the upper surface. The next step is forming sidewall spacers adjacent the sides of the gate. The next step is then performing a second amorphization and doping of the substrate adjacent the sidewall spacers to transform portions beneath the extensions to deep drain and deep source regions having a second predetermined depth from the upper surface, and first and second amorphous-crystalline interfaces within the Si substrate. At this point, the deep drain and the extension above it can be considered a single "drain" region. Likewise, the deep source and the extension above it can be considered a single "source" region. The next step is depositing a metal layer atop the upper surface of the Si substrate over the drain and source regions. The next step is performing backside irradiation. This is accomplished using a first radiation beam incident the lower surface of the Si substrate. The energy from this beam is used to initiate XRC at the first and second amorphous-crystalline interfaces such that heat is provided to the deep drain and source regions and propagates toward the upper surface of the Si substrate and the metal layer so as to initiate diffusion of metal in the metal layer into upper portions of the drain and source regions. This results in the formation of the silicide regions in the upper portions of the drain and source regions. The silicide regions so formed have a low sheet resistance, i.e., 5Ω/sq or less. The final step is removing the metal layer that remains after the diffusion of metal is completed.

DETAILED DESCRIPTION OF THE INVENTION

The present invention pertains to a method of forming a silicide region on a silicon substrate in the manufacturing of semiconductor integrated devices, and such devices having a silicide region formed by the method of the present invention.

The method of the present invention produces a suicide region on a Si substrate that is useful for a variety of purposes, including the reduction of the electrical contact resistance to the Si substrate or an integrated electronic device formed thereon. First described is a generalized method of forming the suicide region in a silicon (Si) substrate, as a first embodiment of the present invention. Then, a method of fabricating a metal-insulator-semiconductor field effect transistor (MISFET) is described as a second embodiment of the present invention. The insulator could be silicon dioxide ($SiO_2$) or a composite layer of $SiO_2$ with other insulating materials and the semiconductor could be silicon or III–V compounds or Si-Ge alloys or III–V compound alloys. The metal could be, for example, doped polysilicon, aluminum, or a refractory metal.

FIRST EMBODIMENT

Figure 1A:
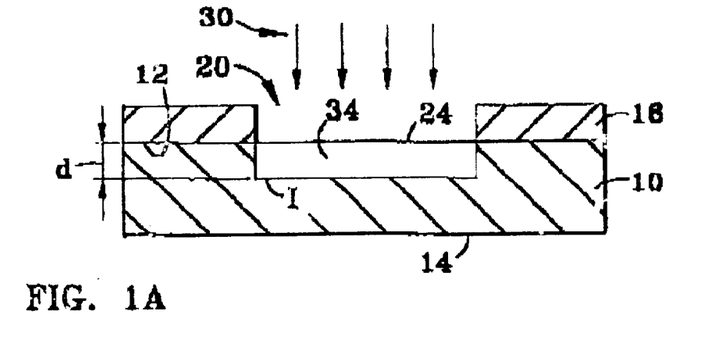
FIG. 1A is cross-sectional schematic diagram of a Si substrate with a mask layer, the substrate being irradiated with an implant beam so as to amorphize a region in the substrate.

With reference to FIG. 1A, the first step of the present method is providing a silicon (Si) substrate 10 having an upper surface 12 (also referred herein as the "front-side" of the Si substrate) and a lower surface 14 (also referred to as the "backside" of the Si substrate). Si substrate 10 is subjected to processing to form a silicide region in accordance with the first embodiment of the present invention. Si substrate 10 could be, for example, a silicon wafer, a silicon-on-insulator substrate, a silicon epitaxial layer, or a poly-silicon layer on an insulator.

The second step is then forming a mask layer 16 on upper surface 12 of Si substrate 10 that is patterned to form a window 20 exposing a portion 24 of upper surface 12. Window 20 defines a portion of Si substrate 10 within which it is desired to form a silicide region. As known to persons of ordinary skill in this technology, mask layer 16 can be any one of a variety of suitable substances (e.g., photoresist or oxide) patterned using a variety of well-known techniques.

The third step is then amorphizing exposed portion 24 of Si substrate 10, preferably through an ion implantation process 30. The implanted ions destroy the chemical bonds between silicon atoms in Si substrate 10 so that the atomic structure therein is made relatively disordered and random, as compared with the portions of the Si substrate that are not subjected to such ion bombardment. Preferably, the ion species, the implantation energy and the dosage are selected to produce an amorphized region 34 such that it extends to a predetermined depth d. In general, selecting an ion species with a relatively light atomic weight, and/or increasing the ion implantation energy in ion implantation process 30 will each have the effect of increasing the depth d of the amorphous region. Conversely, selecting an ion species with relatively heavy atomic weight, and/or decreasing the ion implantation energy in ion implantation process 30 will each have the effect of decreasing the depth of amorphous region 34. A number of ion species can be used to produce the amorphous region. For example, the ion species can include silicon, argon, arsenic, or germanium. The ion implantation energy can be in a range from 10 to 100 kilo-electronVolts (keV) at a dosage in a range from $10^{13}$ to $10^{15}$ ions/$cm^2$. In a preferred embodiment, the depth d to which amorphized region 34 extends into Si substrate 10 is predetermined to be less than 1000 angstroms. To produce an amorphized region 34 having a depth d of 300 angstroms, it is preferable that germanium ions implanted at an energy of about 20 keV with a dosage of about $3\times10^{14}$ atoms/$cm^2$ be used. Ion implantation process 30 can be performed with a device such as the 9500 XR ION IMPLANTER#, commercially available from Applied Materials, Inc., of San Jose, Calif. An amorphous-crystalline interface I is formed between Si substrate 10 (which is crystalline) and amorphous region 34.

Figure 1B:
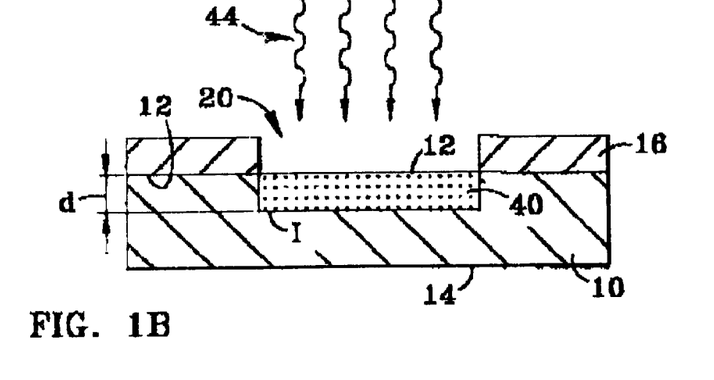
FIG. 1B is a cross-sectional schematic diagram of the Si substrate of FIG. 1A being further irradiated with an implant beam so as to implant dopants into the amorphous region.

With reference now to FIG. 1B, the fourth step after the above-described amorphization step is implanting amorphous region 34 with an n-type or p-type dopant, as indicated by dopant implant beam 44, thereby forming an amorphous doped region 40. In practice, any one of a number of conventional dopant implant techniques can be used.

After performing amorphizing implant 30 and dopant implant 44, the fifth step is removing mask layer 16. This is accomplished, for example, by use of a chemical solvent, by mechanical abrasion, and/or other by techniques well known to persons skilled in the art of semiconductor processing.

Figure 1C:
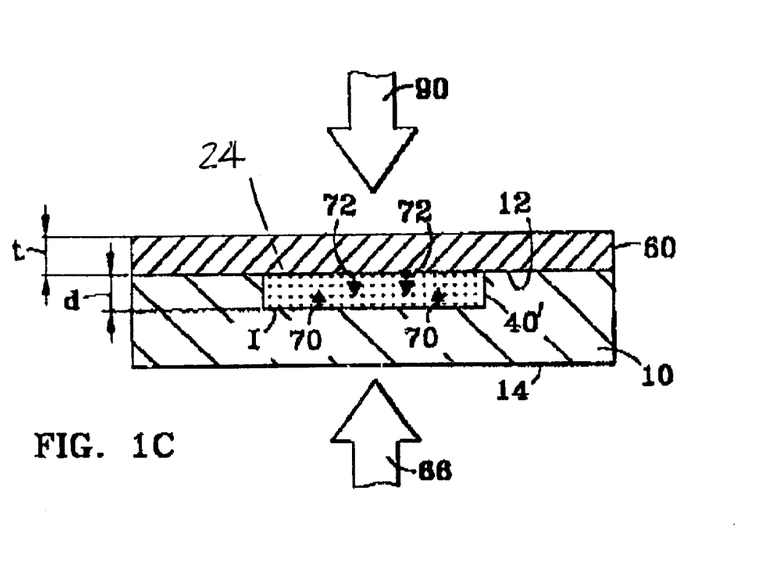
FIG. 1C is a cross-sectional schematic diagram of the Si substrate of FIG. 1B having a metal layer formed thereon and being further subject to at least one of front-side and backside irradiation to form a silicide region in the doped amorphous region.

With reference now to FIG. 1C, the sixth step of the present method is forming a metal layer 60 over upper surface 12 of Si substrate 10, including over exposed portion 24, which is the upper surface of amorphous doped region 40. Metal layer 60 supplies the metal atoms needed to form the desired silicide compound for electrical contact with Si substrate 10. A number of metal species can be used to form the silicide compound. For example, metal layer 60 can include titanium, cobalt or nickel used to form the silicides $TiSi_2$, $CoSi_2$, or $NiSi$, with resistivities of 15–20 $\mu\Omega$cm, 17–20 $\mu\Omega$cm, and 12–15 $\mu\Omega$cm, respectively. Metal layer 60 is formed preferably by sputtering, but evaporation or chemical vapor deposition can also be used. For example, to form metal layer 60, a suitable sputtering chamber is the ENDURA VHPPVD#, commercially available from Applied Materials, Inc. of San Jose, Calif. Preferably, metal layer 60 is formed to a thickness t determined by the desired silicide thickness or depth and the proportional amount of silicon and metal consumed to form the silicide. More specifically, the thickness t of metal layer 60 should be at least the desired silicide depth divided by the ratio of silicon-to-metal consumed to form the silicide. Thus, to form a $Tisi_2$ slide region 300 angstroms in depth in which, due to the atomic structure and bonding of this particular silicide, a 2.27 angstroms thickness of silicon is consumed per 1 angstrom thickness of titanium (i.e., a consumption ratio of 2.27), the thickness t of metal layer 60 should be at least 300 angstroms/2.27~130 angstroms. This ensures an appropriate stoichiometric quantity of metal will be available in metal layer 60 to form the desired silicide.

With continuing reference to FIG. 1C, a first alternative for the seventh step of the present method is irradiating lower surface 14 of Si substrate 10 with a radiation beam 66. This procedure is referred to herein as "backside irradiation". Preferably, radiation beam 66 comprises pulsed laser light with sufficient irradiance to heat interface I to a temperature sufficient to initiate XRC of doped amorphous region 40. XRC occurs when molten Si starts to solidify into crystalline Si from the primary melt at amorphous-crystalline interface I. The latent heat released by this solidification melts a thin layer of the overlying doped amorphous layers. Latent heat is again released during crystallization of this secondary melt. In this manner, a thin liquid Si layer propagates from the original liquid-solid interface (i.e., amorphous-crystalline interface I) to upper surface 12 of substrate 10. This process is quenched at metal layer 60, as the melting temperature of the metal layer is typically higher than that of amorphous Si.

Figure 1D:
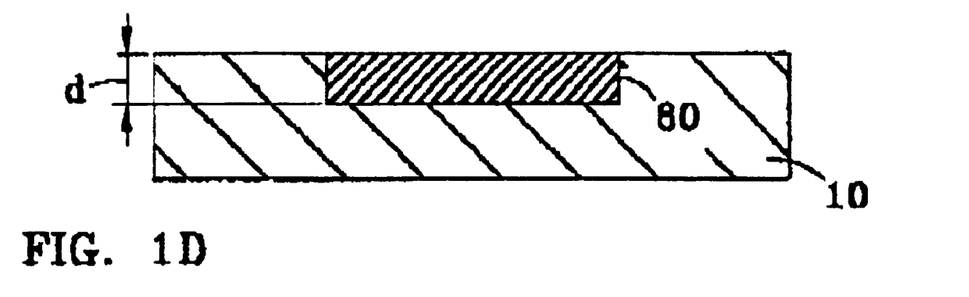
FIG. 1D is a cross-sectional schematic diagram of the Si substrate of FIG. 1C, showing the resultant silicide region.

The temperature sufficient to initiate XRC is in the range between about 1150–1410 degrees centigrade. The upper bound on the temperature range is determined by the lower of the melting temperature of crystalline Si and the melting temperature of metal layer 60. Because amorphous silicon is metastable, it re-crystallizes at a lower temperature than crystalline Si, and also melts at a lower temperature than the crystalline portions of Si substrate 10 that are more atomically ordered. As described above, upon XRC, the heat that builds up at interface I propagates toward upper surface 12 of Si substrate 10 (as indicated by arrows 70) as doped amorphous region 40 re-crystallizes. This heat is then absorbed by metal layer 60, which causes metal atoms in the metal layer to diffuse (as represented by arrows 72) into a now-re-crystallized doped region 40', thereby forming a silicide region 80 within Si substrate 10, as shown in FIG. 1D.

With reference again to FIG. 1C, radiation beam 66 is preferably applied over several pulses to ensure a silicide reaction of the metal (M) in the silicon (i.e., $M+Si \rightarrow MSi_x$). Each radiation pulse in radiation beam 66 preferably has a wavelength between 1–2 microns. In this wavelength range, radiation will travel through crystalline Si but will be absorbed in the doped amorphized region 40'. The temporal pulse width of radiation beam 66 is preferably between 1 to 100 nanoseconds. The repetition rate of the pulses making up radiation beam 66 is preferably between 1 to 1000 Hz. Between pulses of radiation beam 66, Si substrate is allowed to cool to room temperature. To ensure that the backside irradiation step is performed so amorphous region 40 is re-crystallized and that Si substrate 10 and metal layer 60 are maintained in their stable phases, radiation beam 66 preferably has an irradiance (fluence) in a range from about 0.1 to 10.0 $J/cm^2$ delivered in a series of 3 to 10 pulses of 10 to 100 nanoseconds, at a repetition rate preferably between 200 Hz and 400 Hz. The exact laser fluence, number of pulses, pulse duration and repetition rate needed to operate within the process margin of the method of the present invention will vary between the different kinds of radiation sources (e.g., lasers) and the suicide thickness of silicide region 80. Accordingly, like most semiconductor processes, these parameters may need to be determined empirically.

The irradiation of Si substrate 10 is preferably performed in a chamber with an inert atmosphere of nitrogen, argon or helium. A suitable chamber is the P-GILA™ machine commercially available from Ultratech Stepper, Inc., San Jose, Calif. With proper delivery of radiation beam 66 in accordance with the above-described guidelines and principles, the temperature window over which doped amorphous region 40 undergoes XRC while Si substrate 10 and metal layer 60 remain in their solid states, occurs over a relatively large range from about 1150–1410 degrees centigrade. This represents a temperature difference range on the order of 300 degrees centigrade. Thus, the process margin available for successful performance of the method of the present invention relative to conventional silicidation techniques is greatly enhanced.

With continuing reference to FIG. 1C, a second alternative for the seventh step of the present method is performing front-side irradiation using a radiation beam 90 incident upper surface 12 of substrate 10, in combination with backside irradiation using radiation beam 66. The purpose of this dual irradiation is to facilitate silicidation. In this case, the front side irradiation with radiation beam 90 is used to heat metal layer 60 to further drive the diffusion of the metal (arrows 72) into doped amorphous region 40 and to further drive the subsequent reaction of the metal and the silicon, to form a silicide region 80 (FIG. 1D). Heat from radiation beam 90 may, for example, also be used to assist in melting doped amorphized region 40. In the case of metal layer 60 comprising Ti, the radiation beam 90 preferably has a wavelength of 0.1 to 2 $\mu$m, a temporal pulse length of less than 1 ms, and an irradiance of between 0.1 to 2 $J/cm^2$. For the backside irradiation with radiation beam 66, the conditions are similar to the first alternative for this step of the present embodiment, as described above. The exact irradiance, number of pulses, pulse duration and repetition rate needed to operate within the process margin of the present method in this second alternative will vary depending on the parameters associated with the front and backside irradiation. Accordingly, these parameters may need to be determined empirically.

Figure 1E:
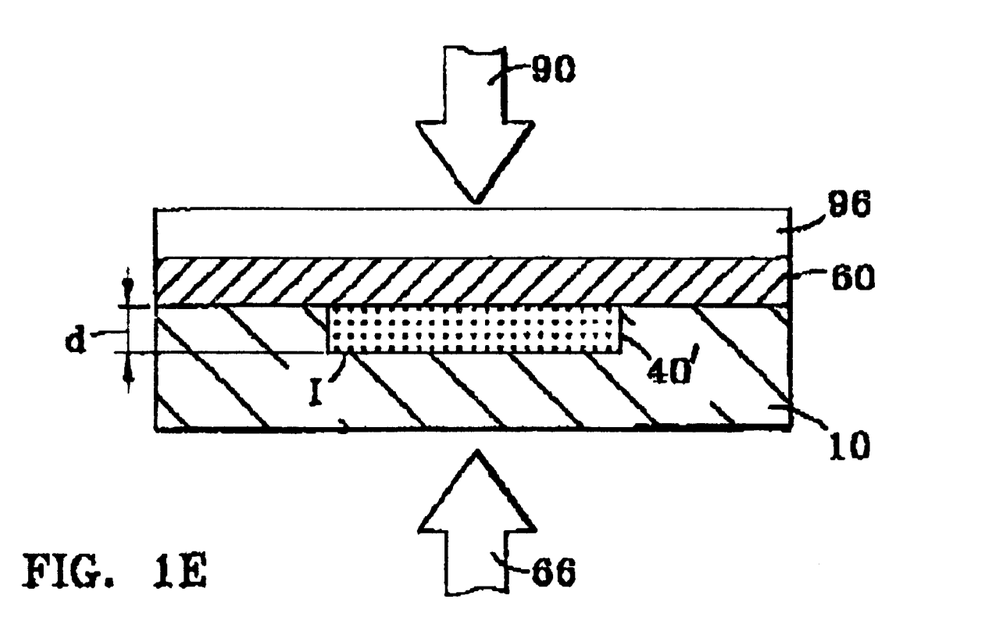
FIG. 1E is a cross-sectional schematic diagram of the Si substrate of FIG. 1C, but with a conformal layer formed atop the metal layer.

With reference now to FIG. 1E, a third alternative for the seventh step of the present embodiment is a variation of the second alternative set forth above, and includes depositing a conformal absorbing layer 96 atop metal layer 60 to facilitate heat absorption during front-side irradiation. The material making up conformal layer 96 and its thickness are designed to partially absorb radiation beam 90 incident thereon and to diffuse heat from the absorbed radiation to the underlying structure. Accordingly, conformal layer 96 needs to be a natural diffuser of heat and must be capable of withstanding high temperatures, i.e., temperatures in excess of the crystalline Si melting temperature of about 1500 degrees C. Conformal layer 96 must also be easily removable (i.e., strippable) without impacting the layers below. An additional role of conformal layer 96 is to maintain the physical structure of the device during processing. An exemplary material for conformal layer 96 is tantalum nitride (TaN), deposited to a thickness of between 500 and 1000 angstroms via sputtering or by chemical vapor deposition. Other preferred materials for conformal layer 96 include titanium (Ti), titanium nitride (TiN), tantalum (Ta), and tungsten nitride (WN).

After backside irradiation (or front-side and backside irradiation in combination), the previously doped amorphous region 40 (FIG. 1B) recrystallizes to form re-crystallized doped region 40'. The diffusion of metal atoms (M) from metal layer 60 further results in the formation of silicide region 80 (FIG. 1D) comprising a compound of the form $MSi_x$ having essentially the desired composition for the silicide that is to be ultimately formed in Si substrate 10. Region 80 may be in a partially crystallized state in which the atoms of the suicide are relatively ordered, yet not entirely so. For $TiSi^2$ silicide, for example, this partially crystallized phase is referred to as its "C49 phase." In addition, the n-type or p-type dopant added to suicide region 80 becomes activated through dopant trapping upon recrystallization of amorphous doped region 40.

The eighth step of the process involves optionally irradiating silicide region 80 to re-melt this region to change the silicide stoichiometry. For example, where the metal in metal layer 60 is titanium, additional pulsed front side irradiation of the region using radiation beam 90 can be used to drive the silicide from $TiSi_3$ to $TiSi_{2.5}$ to $TiSi_2$, the latter being the preferable form of titanium suicide. This leaves silicide region 80 with the desired compound, which in the case of $TiSi_2$ is the C54 phase. The C49 and C54 phases have the same stoichiometry, but are different phases each containing activated dopants. The eighth step can also be performed by conventional rapid thermal annealing (RTA). However, RTA would prolong the process and likely cause additional unwanted diffusion of the metal and dopants. The above process results in a suicide region having a sheet resistance of 5 $\Omega$/sq or less.

The ninth and final step in the process involves stripping the remaining unreacted (i.e., undiffused) portion of metal layer 60 (and also conformal layer 96, if used) from Si substrate 10. The stripping of metal layer 60 can be performed with a 4:1 solution of sulfuric acid ($H_2SO_4$) and hydrogen peroxide ($H_2O_2$) heated to 120 degrees centigrade. Typically, immersion of Si substrate 10 for about ten minutes is all that is required to remove metal layer 60, although the time necessary to strip the metal layer can vary to a degree depending upon the type of metal and its thickness. Immersion can be performed in a spray etch tool like the EQUINOX™ made by SEMITOOL™ of Kalispell, Mont.

Second Embodiment

The second embodiment of the present invention is a method of forming a semiconductor transistor using the method of the first embodiment of the present invention.

Figure 2A:
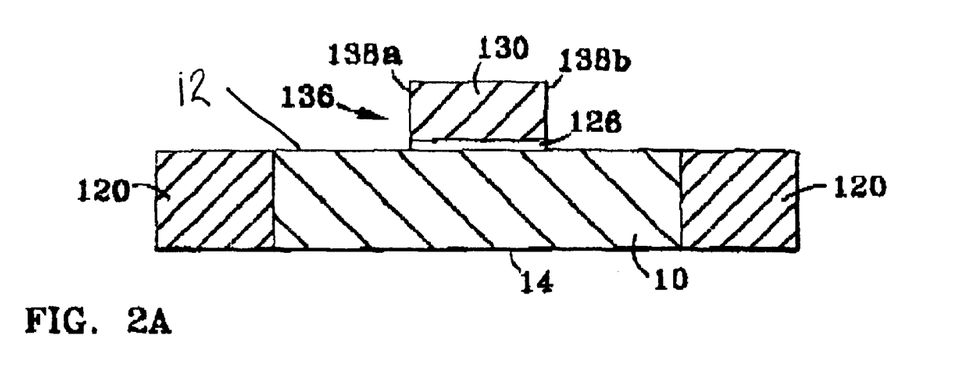
FIG. 2A is a cross-sectional schematic diagram of a Si substrate having formed therein shallow trench isolations and a gate atop the substrate upper surface.

FIGS. 2A–2F are cross-sectional diagrams outlining the method steps of forming an integrated metal-insulator-semiconductor field-effect transistor (MISFET) device on Si substrate 10. The latter has a low dopant concentration (e.g., $10^{15}$–$10^{16}$ ions/cm$^3$). With reference first to FIG. 2A, the first step of the second embodiment is forming spaced apart shallow trench isolations (STIs) 120 to electrically isolate an area of Si substrate 10 in which the MISFET device is to be formed. STIs 120 are formed by first etching spaced apart trenches into upper surface 12 of Si substrate 10, and then filling the trenches with an insulating material (e.g., an oxide such as silicon dioxide). Upper surface 12 of Si substrate 10 is then chemically-mechanically polished, resulting in a planarized upper surface.

After STIs 120 are formed, the second step is forming a gate 136 using techniques well-known in the art of semiconductor technology. This involves forming a gate insulator layer 126 on upper surface 12 of Si substrate 10. Gate insulator layer 126 can be an oxide layer, for example, in which case the resulting device is a MOSFET. A poly-silicon or amorphous silicon layer 130 is then deposited by low-pressure chemical vapor deposition, for example, atop gate insulator layer 126. Gate silicon layer 130 and gate oxide layer 126 are then patterned using a resist layer to selectively form or etch the silicon layer and the gate insulator layer to form the silicon gate body ("gate") 136, which includes a portion of gate Insulator layer 126. Gate 136, as represented in the cross-sectional view of FIG. 2A, has first and second sides 138a and 138b.

Figure 2B:
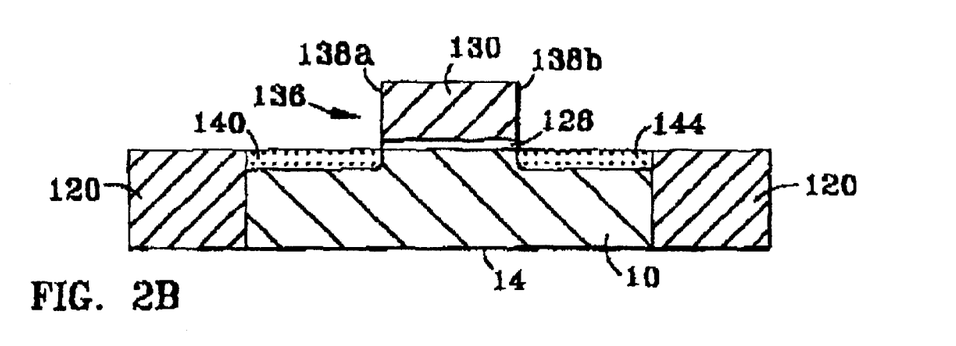
FIG. 2B is a cross-sectional schematic diagram of the Si substrate of FIG. 2A, further including a doped amorphous region.

With reference now to FIG. 2B, the third step of the present embodiment involves forming extension regions 140 and 144, respectively, by amorphizing Si substrate 10 on either side of gate 136 to a predetermined depth, as described above in connection with the first embodiment of the present invention. Extensions 140 and 144 are then doped with appropriate n- or p-type dopants, also as described above. If Si substrate 10, and hence the MISFET channel, is p-type, extension regions 140 and 144 are doped with n-type dopants. On the other hand, if Si substrate 10 is n-type, then extension regions 140 and 144 are doped with p-type dopants.

Figure 2C:
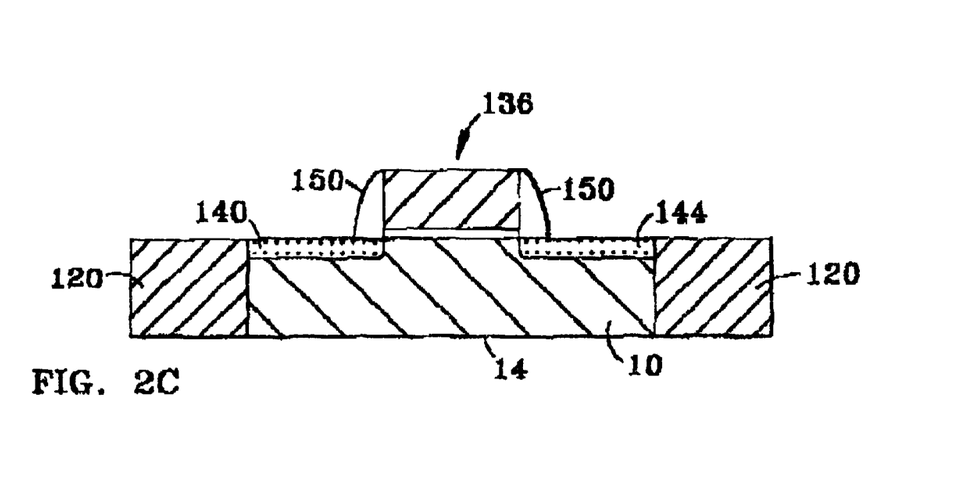
FIG. 2C is a cross-sectional schematic diagram of the Si substrate of FIG. 2B, further including sidewall spacers adjacent the sides of the gate.

With reference now to FIG. 2C, the fourth step of the present embodiment is forming sidewall spacers 150. This is accomplished by forming an insulator layer (not shown) atop upper surface 12 of Si substrate 10 and gate 136. This insulator layer is then anisotropically etched to form insulator sidewall spacers 150 on sides 138a and 138b of gate 136. Sidewall spacers 150 help to achieve self-alignment of the position of the silicide regions yet to be formed, and also prevent horizontal diffusion into gate 136.

Figure 2D:
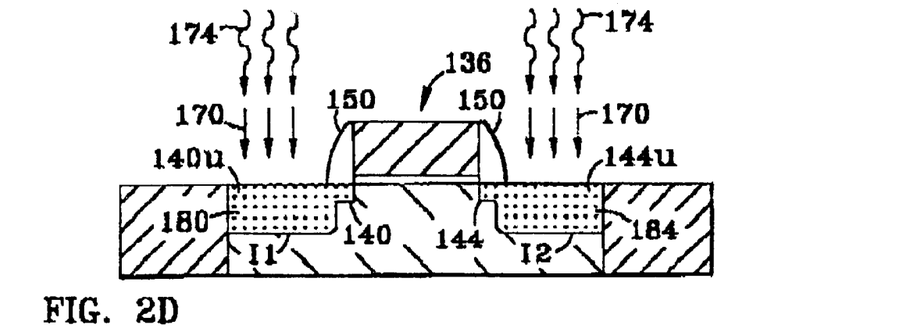
FIG. 2D is a cross-sectional schematic diagram of the Si substrate of FIG. 2B, showing the deep dopant amorphizing implant and deep dopant implant steps.

With reference now to FIG. 2D, the fifth step of the present embodiment involves performing a second deeper amorphizing implant 170 and a second deeper dopant implant 174 beneath extension regions 140 and 144, thereby respectively forming an amorphous deep drain region 180 and an amorphous deep source region 184. This process leaves a portion of extensions 140 and 144 under sidewall spacers 150. A first amorphous-crystalline interface I1 separates deep drain region 180 and crystalline Si substrate 10, and a second amorphous-crystalline interface I2 separates deep source region 184 from the crystalline SI substrate. At this point, deep drain region 180 and extension 140 can be considered a single "drain" region, and deep source region 184 and extension 144 can be considered a single "source" region.

Figure 2E:
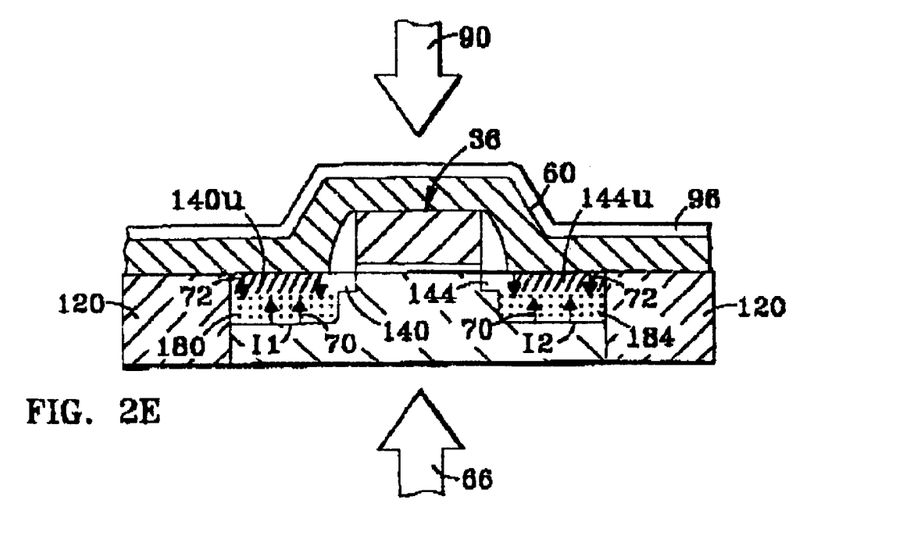
FIG. 2E is a cross-sectional schematic diagram of the Si substrate of FIG. 2B, further including a metal layer, an optional conformal layer, and front-side and backside irradiation to initiate XRC.
Figure 2F:
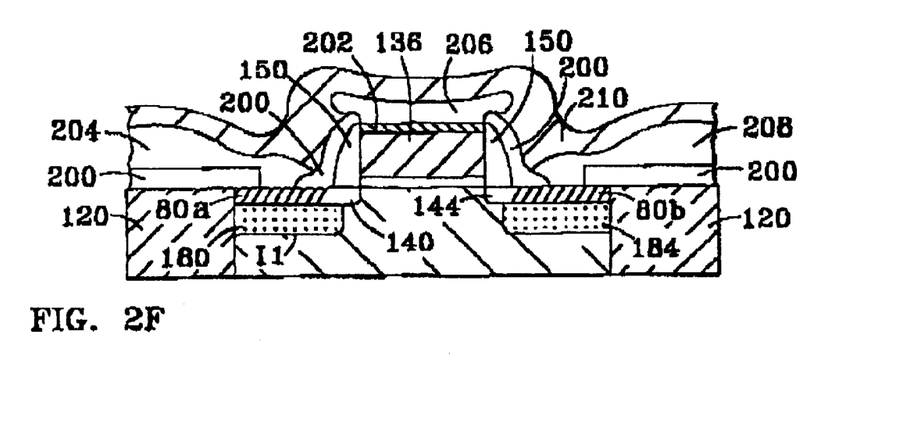
FIG. 2F is a cross-sectional schematic diagram of a resulting integrated MISFET device according to the present invention.

With reference now to FIG. 2E, the sixth step of the present embodiment involves forming a metal layer 60 atop upper surface 12 of Si substrate 10 covering extension regions 140 and 144. Preferably, metal layer 60 is a species such as titanium, cobalt or nickel formed on the amorphous regions by sputtering, evaporation or chemical vapor deposition, as previously described in connection with the first embodiment of the present invention.

A first alternative for the eighth step of the present embodiment involves performing backside irradiation of Si substrate 10 with radiation beam 66 having a wavelength, irradiance, number of pulses, pulse duration and repetition rate such as described above in connection with the first embodiment of the present invention. Backside irradiation with radiation beam 66 serves to heat interfaces I1 and I2. As described above in connection with the first embodiment, this heat causes XRC, which propagates heat toward upper surface 12 (as indicated by arrows 70) so as to heat metal layer 60, deep drain region 180 and deep source region 184. This heating causes diffusion of metal atoms from metal layer 60 into Si substrate 10 (as indicated by arrows 72), and more particularly, into extension regions 140 and 144, thereby forming suicide regions 80a and 80b, respectively, in the upper portions 140u and 144u of these regions. Note how metal atoms from metal layer 60 do not diffuse into the sections of extensions 140 and 144 extending beneath sidewall spacers 150.

XRC also serves to activate deep drain and deep source regions 180 and 184 upon re-crystallization via dopant trapping. The heat from XRC may be sufficiently large to cause deep drain and deep source regions 180 and 184 to melt, while not melting Si substrate 10. Accordingly, with reference to FIG. 2F, upper portions 140u and 144u of extension regions 140 and 144, respectively, become a silicide regions 80a and 80b, respectively, as described immediately above, and as also described in connection with the first embodiment (FIG. 1D). After irradiation, regions 80a and 80b cool to a chemical form that is at least partially crystalline.

A second alternative for the eight step of the present embodiment, referring again to FIG. 2E, involves performing front side irradiation with radiation beam 90 in combination with backside irradiation with radiation beam 66 to heat metal layer 60. This facilitates the diffusion of metal atoms from metal layer 60 into extension regions 140 and 144, thereby forming regions 80a and 80b therein, as described above in connection with the first embodiment of the present invention.

A third alternative for the eight step of the present embodiment is depositing a conformal absorbing layer 96 atop metal layer 60 to facilitate heat transfer to the metal layer and to Si substrate 10, as described above in connection with the first embodiment of the invention.

The ninth step of the present embodiment involves optionally irradiating silicide regions 80a and 80b to re-melt these regions to improve their stoichiometry, as previously described above in connection with the first embodiment of the invention. This step can be replaced by conventional rapid thermal annealing, but this would prolong the manufacturing process and would cause excess diffusion of dopants, thereby diminishing device performance.

The tenth step of the present embodiment involves stripping the (remaining) metal layer 60 (and conformal layer 96, if used) from Si substrate 10, also as previously described. This leaves the basic elements of a MISFET device structure, with silicide regions 80a and 80b having the desired stoichiometry.

Further processing steps are then performed to finalize the MISFET device. For example, with reference to FIG. 2F, a first insulator layer 200 is formed atop STIs 120 and silicide regions 80a and 80b, and also adjacent side wall spacers 150. A metallic contact 202 is then formed atop gate 136 using any one of a number of techniques known in the art. Insulator layer 200 is then selectively patterned to expose silicide regions 80a and 80b. Conductive leads 204, 206 and 208 composed of aluminum or other conductive metal, are formed and patterned so as to make physical contact with silicide regions 80a and 80b, and metal contact 202 of gate 136, respectively, of the MISFET device. A second insulator layer 210 comprising silicon oxide, for example, is then formed over conductive leads 204, 206 and 208 to electrically insulate and protect the conductive leads and the MISFET device. At respective ends opposite those in contact with the silicide regions, leads 204, 206 and 208 are coupled to other electronic components, and/or power or signal sources.

In the present invention, the use of backside irradiation of the Si substrate to initiate XRC to cause the metal layer to diffuse into the amorphous doped region helps reduce heating of the Si substrate so that integrated devices formed on the Si substrate are not subjected to prolonged heating that could otherwise damage such devices, a problem that significantly reduces the effectiveness of conventional silicidation techniques. In the invented method, irradiation of the amorphous doped region(s) can be effectively accomplished within a process margin in which the amorphous doped region re-crystallizes or becomes molten, while the Si substrate and the metal layer remain in their solid phases, that spans a temperature range on the order of 300 degrees centigrade. Thus, the process of providing heat to Si substrate by backside or backside and front-side irradiation can deviate significantly from the optimum heating value in the middle of the temperature range without adverse impact to the Si substrate or the suicide region. This feature of the method of the present invention makes possible the formation of silicide contacts without significant increase in the risk of causing a leakage path or other defect in the Si substrate or integrated device formed therein.

The method of the present invention can be used to perform silicidation at a much faster rate as compared to conventional silicidation techniques, particularly those that require implantation of a stoichiometric quantity of metal ions to form the suicide region. In point of fact, the invented method requires implantation of only $10^{13}$ to $10^{15}$ ions/cm$^2$, whereas conventional silicidation techniques require implantation on the order of $10^{16}$ to $10^{17}$ ions/cm$^2$. Thus, conventional silicidation techniques take ten to ten-thousand times longer to perform in comparison to the invented method. Accordingly, the throughput for the silicidation of Si substrates using the method of the present invention is much greater than is possible with conventional silicidation techniques.

Also, with ion implantation of the scale needed to implant a stoichiometric quantity of metal ions required in conventional silicidation techniques, the occurrence of 'knock-on' and hence the formation of leakage paths, is undesirably increased. In contrast, the relatively low ion implantation dosages required by the invented method minimize the probability of knock-on on a scale that could adversely affect the Si substrate or its integrated devices.

The many features and advantages of the present invention are apparent from the detailed specification and thus, it is intended by the appended claims to cover all such features and advantages of the described method which follow in the true spirit and scope of the invention. Further, since numerous modifications and changes will readily occur to those of ordinary skill in the art, it is not desired to limit the invention to the exact construction and operation illustrated and described. Moreover, the method of the present invention, like related methods used in the semiconductor arts, are often best practiced by empirically determining the appropriate values of the operating parameters. Accordingly, all suitable modifications and equivalents should be considered as falling within the spirit and scope of the invention.

What is claimed is:

1. A method of forming a silicide region in a crystalline Si substrate having an upper surface and a lower surface, comprising the steps of:
    a) forming an amorphous doped region in the Si substrate at or near the upper surface to a predetermined depth, thereby forming an amorphous-crystalline interface between said amorphous doped region and the crystalline Si substrate;
    b) forming a metal layer in contact with said amorphous doped region; and
    c) performing backside irradiation with a first radiation beam to heat said interface to initiate explosive recrystallization of said region, thereby providing heat to said metal layer sufficient to cause diffusion of metal from said metal layer into said amorphous doped region, thereby resulting in the silicide region being formed in said amorphous doped region.

2. A method according to claim 1, wherein said first radiation beam has a wavelength in the range between 1 micron and 2 microns, a temporal pulse length in the range between 1 nanosecond and 100 nanoseconds, and an irradiance of between 0.1 J/cm$^2$ and 10.0 J/cm$^2$.

3. A method according to claim 2, wherein said first radiation beam comprises between 3 and 10 pulses at a repetition rate between 200 and 400 Hz.

4. A method according to claim 1, wherein said metal layer comprises a metal selected from the group of metals comprising: titanium, cobalt or nickel.

5. A method according to claim 1, further including the step, after said step c), of:
    d) removing said metal layer.

6. A method according to claim 1, further including the step, after said step b), of:
    1) performing front-side irradiation with a second radiation beam so as to facilitate diffusion of said metal layer into said amorphous doped region to form the silicide region.

7. A method according to claim 1, wherein said step c) further includes the step of:
    d) performing an additional at least one of front-side irradiation and backside irradiation to facilitate silicide formation in the silicide region.

8. A method according to claim 6, wherein said second radiation beam has a wavelength between 0.1 and 2 microns, a temporal pulse length of less than 1 millisecond, and an irradiance between 0.1 J/cm$^2$ and 2 J/cm$^2$.

9. A method according to claim 6, further including the step, prior to step d), of:
    2) depositing a strippable absorbing conformal layer atop said metal layer so as to absorb radiation from said second radiation beam and to transfer heat from said absorbed radiation to said metal layer.

10. A method according to claim 9, further including the step, after aid step c), of:
    3) removing said conformal layer and said metal layer.

11. A method according to claim 1, wherein the silicide region has a sheet resistance of 5 Ω/sq or less.

12. A method according to claim 1, wherein:
    the silicide region is formed in at least one of a source and drain of a transistor; and
    said method further comprising the step, after said step c), of:
        d) patterning at least one insulator layer and at least one conductive layer to form a conductive path that contacts the suicide region.

13. A method according to claim 1, wherein said step b) includes the step of:
    1) depositing a metal onto said amorphous doped region of the Si substrate by one of sputtering, evaporating, and chemical vapor deposition.

14. A method according to claim 1, wherein said first radiation beam comprises light from a laser.

15. A method according to claim 6, wherein said second radiation beam comprises light from a laser.

16. A method according to claim 1, wherein said step a) includes the step of:
    1) implanting dopant atoms with a dosage in the range from $10^{13}$–$10^{16}$ atoms/cm$^2$.

17. A method of forming a MISFET device in a Si substrate having upper and lower surfaces and first and second silicide regions, comprising the steps of:
    a) forming spaced apart shallow trench isolations in the Si substrate;
    b) forming, atop the upper surface of the Si substrate and between said shallow trench isolations, a gate having sides;
    c) performing a first amorphization and doping of first and second portions of the Si substrate adjacent said gate to form first and second extension regions to a first predetermined depth from the upper surface;
    d) forming sidewall spacers adjacent said sides of said gate;
    e) performing a second amorphization and doping of the substrate beneath a portion of said first and second extensions adjacent said sidewall spacers thereby forming deep drain and deep source regions having a predetermined depth from the upper surface, and thereby forming first and second amorphous-crystalline interfaces within the Si substrate;
    f) depositing a metal layer atop the upper surface of the Si substrate over said deep drain and deep source regions;
    g) performing backside irradiation with a first radiation beam incident the lower surface of the Si substrate to initiate XRC at said first and second amorphous-crystalline interfaces such that heat is provided to said deep drain and deep source regions and said metal layer so as to initiate diffusion of metal in said metal layer into said first and second extension regions, respectively, thereby forming the first and second silicide regions in said first and second extension regions; and h) removing said metal layer.

18. A method according to claim 17, further including the step, in combination with said step g), of:

1) performing front-side irradiation with a second radiation beam incident said metal layer.

19. A method according to claim 17, further inducing the steps, after said step f), of:

1) depositing an absorbing conformal layer atop said metal layer; and
2) performing front-side irradiation with a second radiation beam incident said conformal layer.

20. A method according to claim 17, further including the step, after said step g), of:

1) performing an additional at least one of front-side irradiation and backside irradiation to facilitate silicide formation in the silicide region.

21. A method according to claim 17, further including the steps of:

i) forming an insulating layer over the upper surface of the Si substrate so as to cover a portion of said shallow trench isolations and said sidewall spacers; and
j) forming conductive leads atop said insulating layer so as to contact portions of said silicide regions and said gate.

22. A method according to claim 17 wherein said first radiation beam has a wavelength in the range between 1 micron and 2 microns, a temporal pulse length in the range between 1 nanosecond and 100 nanoseconds, and an irradiance of between 0.1 J/cm$^2$ and 10.0 J/cm$^2$.

23. A method according to claim 17, wherein said first radiation beam comprises between 3 and 10 pulses at a repetition rate between 200 and 400 Hz.

24. A method according to claim 17, wherein said metal layer comprises a metal selected from the group of metals comprising: titanium, cobalt or nickel.

25. A method according to claim 18, wherein said second radiation beam has a wavelength between 0.1 and 2 microns, a temporal pulse length of less than 1 millisecond, and an irradiance between 0.1 J/cm$^2$ and 2 J/cm$^2$.

26. A method according to claim 17, wherein said step b) further includes the step of:

1) depositing a gate insulator layer atop the Si substrate upper surface, then forming a gate atop the gate insulating layer.

27. A method according to claim 17, wherein said doping of said first and second portions of the Si substrate in said step c) includes the step of:

1) implanting dopant atoms with a dosage in the range from $10^{13}$–$10^{16}$ atoms/cm$^2$.

* * * * *